(12) United States Patent
Namikawa et al.

(10) Patent No.: US 7,718,255 B2
(45) Date of Patent: May 18, 2010

(54) CLEANING SHEETS AND METHOD OF CLEANING WITH THE SAME

(75) Inventors: Makoto Namikawa, Ibaraki (JP); Yoshio Terada, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/642,652

(22) Filed: Aug. 19, 2003

(65) Prior Publication Data
US 2005/0042958 A1  Feb. 24, 2005

(51) Int. Cl.
B32B 15/04 (2006.01)
(52) U.S. Cl. .................................. 428/343; 442/149
(58) Field of Classification Search .............. 428/343; 442/64, 65, 76, 149
See application file for complete search history.

(56) References Cited

U.S. PATENT DOCUMENTS

| | | | |
|---|---|---|---|
| 3,149,364 A | 9/1964 | Baptist et al. | |
| 5,415,889 A | 5/1995 | Uchida et al. | |
| 5,853,633 A | 12/1998 | Kono et al. | |
| 5,902,678 A | 5/1999 | Konda et al. | |
| 6,055,392 A | 4/2000 | Huver et al. | |
| 6,126,772 A | 10/2000 | Yamamoto et al. | |
| 6,170,115 B1 | 1/2001 | Tanaka et al. | |
| 6,248,857 B1 | 6/2001 | Misumi et al. | |
| 6,663,306 B2 | 12/2003 | Policicchio et al. | |
| 6,741,086 B2 | 5/2004 | Maekawa et al. | |
| 6,845,225 B2 * | 1/2005 | Toyoda et al. | 399/327 |
| 2008/0173329 A1 * | 7/2008 | Namikawa et al. | 134/6 |

FOREIGN PATENT DOCUMENTS

| | | |
|---|---|---|
| DE | 19702546 | 1/1997 |
| DE | 29805040 | 3/1998 |
| EP | 0-416-645 A2 | 3/1991 |
| EP | 0 658 828 A1 | 6/1995 |
| EP | 930 538 A1 * | 1/1999 |
| JP | 58-50435 U | 4/1983 |
| JP | 61-138253 A | 6/1986 |
| JP | 1-187458 A | 7/1989 |
| JP | 2091241 A | 3/1990 |
| JP | 5326471 A | 12/1993 |
| JP | 6-173041 A | 6/1994 |
| JP | 6-274072 | 9/1994 |
| JP | 7-41737 A | 2/1995 |
| JP | 7065362 A | 3/1995 |
| JP | 07-128368 | 5/1995 |
| JP | 7-142440 A | 6/1995 |
| JP | 7-236863 A | 9/1995 |
| JP | 08-85070 A | 4/1996 |
| JP | 8-115896 A | 5/1996 |
| JP | 8-115897 | 5/1996 |
| JP | 8-139067 A | 5/1996 |
| JP | 08124892 | 5/1996 |
| JP | 8181158 | 7/1996 |
| JP | 8323572 | 12/1996 |
| JP | 9028645 A | 2/1997 |
| JP | 10-129078 A | 5/1998 |
| JP | 10-154686 A | 6/1998 |
| JP | 11-043656 A | 2/1999 |
| JP | 11-228994 A | 8/1999 |
| JP | 11224895 | 8/1999 |
| JP | 11269436 | 10/1999 |
| JP | 2000-109530 A | 4/2000 |
| JP | 2000-128945 A | 5/2000 |
| JP | 2000-288482 A | 10/2000 |
| JP | 2000312862 | 11/2000 |
| JP | 2001-181962 A | 7/2001 |
| JP | 2001-198540 A | 7/2001 |
| JP | 2001-264975 A | 9/2001 |
| JP | 2002-79190 A | 3/2002 |
| JP | 2002-249749 A | 9/2002 |
| JP | 2003-68810 A | 3/2003 |
| JP | 2003-115521 A | 4/2003 |
| KR | 0073655 | 4/1991 |
| WO | 97-00534 | 1/1997 |

OTHER PUBLICATIONS

Kunstsoff-Kompendium, Adolf Franz, Karlheinz Biederbick, First Edition, Vogel-Buchverlag Würzburg 1984, p. 292.
Japanese Office Action dated Apr. 5, 2005 with partial English translation.
Japanese Office Action dated Mar. 6, 2007 with partial English translation.
Japanese Office Action dated Nov. 27, 2006.
Japanese Office Action dated Aug. 15, 2007.
Japanese Notification of Reason for Refusal dated Mar. 10, 2009.

(Continued)

Primary Examiner—Arti Singh-Pandey
(74) Attorney, Agent, or Firm—Sughrue Mion, PLLC

(57) ABSTRACT

The invention provides cleaning sheets for use in cleaning, e.g., various substrate-processing apparatus, systems for conveying exposure masks (reticles) in microfabrication, etc., and a method of cleaning these with the cleaning sheets. A cleaning sheet which comprises a sheet material comprising a thermoset resin layer having porosity and, formed on one side of the sheet material, a pressure-sensitive adhesive layer comprising a thermoplastic resin.

3 Claims, No Drawings

OTHER PUBLICATIONS

Japanese Notification of Reasons for Refusal dated May 26, 2009.
Japanese Notification of Reasons for Refusal dated Jul. 7, 2009.
Japanese Notification of Reasons for Refusal dated Jul. 14, 2009.
Japanese Notification of Reasons for Refusal dated Jun. 30, 2009.
Japanese Office Action dated Nov. 10, 2009.
Notification of Reasons for Refusal issued in Japanese Application No. 2000-177964 dated Feb. 9, 2010.

* cited by examiner

CLEANING SHEETS AND METHOD OF CLEANING WITH THE SAME

FIELD OF THE INVENTION

The present invention relates to cleaning sheets for use in cleaning, e.g., various substrate-processing apparatus, systems for conveying exposure masks (reticles) in microfabrication, etc., and to a method of cleaning them with the cleaning sheets. Particularly, the invention relates to cleaning sheets and a cleaning method for substrate-processing apparatus which should be kept away from foreign particles, e.g., apparatus for producing or inspecting semiconductors, flat panel displays, and printed wiring boards, or for systems for conveying exposure masks (reticles) in microfabrication or the like.

BACKGROUND OF THE INVENTION

In various substrate-processing apparatus, for example, substrates are conveyed while being in physical contact with each conveying system. In this conveyance, when the substrates or the conveying systems have foreign particles adherent thereto, the succeeding substrates are contaminated one after another. It has hence been necessary to periodically stop and clean the apparatus. Because of this, there has been a problem that the cleaning operation results in a reduced time efficiency and necessitates much labor. In order to eliminate such problems, a technique for removing foreign particles adherent to internals of a substrate-processing apparatus by conveying a substrate having a pressure-sensitive adhesive substance bonded thereto has been proposed (e.g., JP-A-10-154686, herein incorporated by reference).

SUMMARY OF THE INVENTION

The technique for removing foreign particles adherent to inner parts of a substrate-processing apparatus by conveying a substrate having a pressure-sensitive adhesive substance bonded thereto is an effective method for overcoming the problem described above. However, there is a possibility in this technique that the pressure-sensitive adhesive substance might adhere too tenaciously to a contact part of the apparatus to be separated therefrom. Namely, this technique has a possibility that the substrate cannot be conveyed without fail or might damage the conveying device. Furthermore, the technique described above has had a problem that since pressure-sensitive adhesives usually have a glass transition temperature lower than 150° C., there are cases where the substrate having a pressure-sensitive adhesive substance bonded thereto cannot be used, because of its poor heat resistance, in apparatus in which heat treatment is conducted at 150° C. or a higher temperature, e.g., ozone ashers, resist coaters, oxidation diffusion ovens, atmospheric-pressure CVD (chemical vapor deposition) systems, low-pressure CVD systems, and plasma-enhanced CVD systems. In view of such circumstances, an object of the invention is to provide cleaning sheets and a cleaning method with which a substrate can be conveyed without fail even into, in particular, a substrate-processing apparatus or conveying system having a high temperature inside and foreign particles adherent to inner parts of the apparatus or to the conveying system can be easily removed without fail.

The present inventors made intensive investigations in order to accomplish the object. As a result, it has been found that when a sheet having a cleaning layer, a transfer member, e.g., a substrate, having the sheet bonded thereto, or the like is conveyed so as to remove foreign particles adherent to inner parts of a substrate-processing apparatus or to other parts, then use of a cleaning layer made of a thermoset resin having porosity is effective in easily separating and removing the foreign particles without fail without posing any of the problems described above. Thus, the invention has been thus completed.

Namely, the invention relates to: a cleaning sheet which comprises a thermoset resin layer having porosity as a cleaning layer (embodiment 1); a cleaning sheet which comprises a support and a thermoset resin layer having porosity formed as a cleaning layer on one side of the support (embodiment 2); a cleaning sheet which comprises a sheet material comprising a thermoset resin layer having porosity and, formed on one side of the sheet material, a pressure-sensitive adhesive layer comprising a thermoplastic resin (embodiment 3); a cleaning sheet which comprises a support, a thermoset resin layer having porosity formed as a cleaning layer on one side of the support, and a pressure-sensitive adhesive layer comprising a thermoplastic resin formed on the other side of the support (embodiment 4); any of these cleaning sheets which is characterized in that the thermoset resin layer having porosity has substantially no tackiness; and others.

DETAILED DESCRIPTION OF THE INVENTION

The cleaning layer in each cleaning sheet of the invention comprises a thermoset resin having porosity. By using a thermoset resin as the cleaning layer in the invention, foreign particles of various sizes can be caught and removed with the porous cleaning layer without fail while preventing the foreign particles from shedding and without arousing a conveyance trouble. The thermoset resin is not particularly limited as long as it comes to have a three-dimensional structure or network structure by the action of heat. Examples thereof include polyimide resins, urea resins, melamine resins, phenolic resins, unsaturated polyester resins, epoxy resins, diacryloylphthalic acid polymers, and the like. In the present invention, the cleaning layer comprising a thermoset resin has porosity and the shape and size of the pores are not particularly limited. However, when a proportion of pores larger than the sizes of foreign particles is too high, it may result in a decrease in the effect of catching foreign particles. The pore diameter of the cleaning layer is generally about from 0.01 to 50 μm, preferably about from 0.05 to 2 μm. The porosity thereof is generally about from 30 to 95%, preferably about from 40 to 90%. The thickness of the cleaning layer is not particularly limited, and can be suitably selected in the range of generally about from 5 to 100 μm. Furthermore, the cleaning layer preferably has a tackiness of 0.05 N/10 mm or lower in terms of the adhesion strength of 180° peeling from a silicon wafer as determined by applying the cleaning layer in a width of 10 mm to the mirror surface of a silicon wafer and measuring the 180° peel strength in accordance with JIS Z0237. As long as the adhesion strength of the cleaning layer is not higher than this value, the cleaning layer can be regarded in the invention as substantially free from tackiness.

Various additives for enhancing surface smoothness, such as a smoothing agent, leveling agent, and defoamer, may be added to the thermosetting resin according to need as long as the addition thereof does not impair the properties of the resin.

The invention further provides: a cleaning sheet which comprises a support and a thermoset resin layer having porosity formed as a cleaning layer on one side of the support (embodiment 2); a cleaning sheet which comprises a sheet material comprising a thermoset resin layer having porosity and, formed on one side of the sheet material, a pressure-sensitive adhesive layer comprising a thermoplastic resin (embodiment 3); and a cleaning sheet which comprises a support, a thermoset resin layer having porosity formed as a cleaning layer on one side of the support, and a pressure-sensitive adhesive layer comprising a thermoplastic resin formed on the other side of the support (embodiment 4). This pressure-sensitive adhesive layer comprising a thermoplastic resin is not particularly limited as long as it satisfies a pressure-sensitive adhesive function and has some degree of heat resistance. However, use can be made of, for example, a polycarbodiimide, polyimide, heat-resistant acrylic resin, fluororesin, polyester resin, or the like. In particular, polycarbodiimides are suitable for use as the cleaning layer in the invention because they do not generate a volatile gas or decomposition monomer even when exposed to high temperatures of 400° C. or above. Of these, the polycarbodiimide having a structural unit represented by the following formula (1):

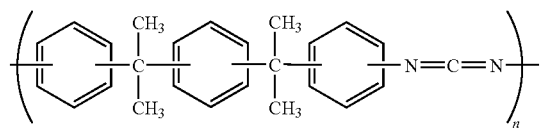

(wherein n is an integer of 2 to 300), which is described in Japanese patent application No. 10-305201, is especially more suitable for use as the cleaning layer in the invention because it has high heat resistance (Tg of 200° C. or higher) and is excellent also in adhesiveness, low-temperature processability, and moisture resistance. However, the invention should not be construed as being limited to cleaning sheets employing a carbodiimide resin having that structure. When the cleaning sheet has this constitution, it can be applied to a transfer member, such as any of various substrates or other tapes/sheets, through the pressure-sensitive adhesive layer comprising a thermoplastic resin to give a transfer member having a cleaning function (embodiment 6). By conveying this transfer member having a cleaning function into an apparatus or conveying system and bringing it into contact with the part to be cleaned, this part can be cleaned (embodiment 7).

A cleaning sheet of the invention may be a sheet comprising a support and the cleaning layer formed thereon. This support is not particularly limited as long as it has heat resistance conforming to the temperature to be used. However, examples thereof include films of plastics such as polyethylene, poly(ethylene terephthalate), acetyl cellulose, polycarbonates, polypropylene, polyamides, polyimides, and polycarbodiimides. The thickness thereof is generally about from 10 to 100 μm. The transfer member to which the cleaning sheet is to be applied is not particularly limited. However, examples thereof include semiconductor wafers, substrates for flat panel displays such as LCDs and PDPs, and substrates for compact disks, MR heads, and the like.

The invention will be explained below based on Examples, but the invention should not be construed as being limited thereto. Hereinafter, "parts" means "parts by weight".

Example

Into a 500-mL four-necked flask equipped with a stirrer, dropping funnel, and reflux condenser were introduced 1,4-bis(4-aminophenylisopropylidene)benzene (17 g; 49.35 mmol), triethylamine (9.99 g; 98.70 mmol), and 146.24 g of tetrahydrofuran. The flask was cooled with an ice bath, and phenyl chloroformate (15.45 g; 98.70 mmol) was put in the dropping funnel and dropped into the flask over 1 minute. Thereafter, the mixture was stirred at room temperature for 120 minutes. After formation of a carbamate was ascertained by IR analysis, trimethylchlorosilane (10.72 g, 98.70 mmol), triethylamine (9.99 g; 98.70 mmol), and a carbodiimide formation catalyst (3-methylphenyl-2-phospholene 1-oxide) (472.2 mg; 2.47 mmol) were introduced into the flask. The resultant mixture was stirred at 60° C. for 1 hour and subsequently at 67° C. for 7 hours to conduct isocyanate formation and polymerization. The formation of a carbodiimide (structure of formula 1) was ascertained from an IR spectrum. The triethylamine hydrochloride generated was removed by filtration to obtain a varnish. The varnish was cast on a glass plate and dried at 90° C. for 30 minutes and then at 250° C. for 30 minutes to obtain a film having flexibility. The film obtained was evaluated for thermal properties. As a result, the glass transition temperature thereof was found to be 220.8° C.

The varnish was applied by spin coating to a porous thermoset polyimide film having a width of 250 mm, thickness of 50 μm, and micropore diameter of from 0.05 to 2 μm. The varnish applied was dried at 90° C. for 30 minutes and then at 250° C. for 30 minutes to form a cleaning layer having a thickness of 20 μm. The cleaning sheet obtained was applied, on the carbodiimide side, to the mirror surface side of an 8-inch silicon wafer placed on an SUS plate heated to 230° C. Thus, a cleaning wafer for transfer A having a cleaning function was produced. The surface of the cleaning layer had substantially no tackiness. The porosity of this cleaning layer was from 40 to 90%. The cleaning layer was applied in a width of 10 mm to the mirror surface of a silicon wafer and the tackiness thereof in terms of the strength of 180° peeling from the silicon wafer was measured in accordance with JIS Z0237. As a result, the tackiness was 0.0009 N/10 mm. The cleaning layer was thus ascertained to have substantially no tackiness. The cleaning wafer A obtained was conveyed for cleaning through an ozone asher the inside of which had been heated to 200° C. As a result, the wafer could be conveyed without arousing any trouble, and the number of foreign particles of 0.2 μm or larger as counted on an 8-inch wafer, which had been 23,500 before that conveyance, decreased to 5,800 through the conveyance. Thus, 75.3% of the initial foreign particles could be removed and a cleaning effect could be ascertained.

Comparative Example

A cleaning wafer B was produced in the same manner as described above, except that a nonporous thermoset polyimide film was used. The cleaning wafer B obtained was conveyed into an ozone asher heated to 200° C. in the same manner as in Example. As a result, the wafer could be conveyed without arousing any trouble, and the number of foreign particles of 0.2 μm or larger as counted on an 8-inch wafer, which had been 25,000 before that conveyance, decreased to 15,000 through the conveyance. Only 40% of the initial foreign particles could be removed.

As described above, the cleaning sheets of the invention can be conveyed without fail through substrate-processing apparatus or conveying systems, especially ones heated to a high temperature inside, and foreign particles adherent to inner parts of the apparatus or to the conveying systems can be easily removed without fail.

While the invention has been described in detail and with reference to specific embodiments thereof, it will be apparent to one skilled in the art that various changes and modifications can be made therein without departing from the scope thereof.

This application is based on Japanese patent application No. 2001-309340 filed Oct. 5, 2001, the entire contents thereof being hereby incorporated by reference.

What is claimed is:

1. A cleaning sheet consisting of a support, a thermoset resin cleaning layer having porosity formed on one side of the support, and a pressure-sensitive adhesive layer comprising a thermoplastic resin formed on the other side of the support, wherein the thermoset resin cleaning layer having porosity has substantially no tackiness.

2. A transfer member having a cleaning function, which comprises a transfer member and the cleaning sheet of claim 1 bonded thereto through the pressure-sensitive adhesive layer comprising a thermoplastic resin.

3. A method of cleaning, which comprises conveying the transfer member of claim 2.

* * * * *